(12) United States Patent
Chang et al.

(10) Patent No.: US 8,603,402 B2
(45) Date of Patent: Dec. 10, 2013

(54) MICROWAVE-EXCITED PLASMA DEVICE

(75) Inventors: Chih-Chen Chang, New Taipei (TW);
Kun-Ping Huang, Miaoli County (TW);
Yu-Tse Hsieh, Taoyuan County (TW)

(73) Assignee: Industrial Technology Research Institute, Hsinchu (TW)

( * ) Notice: Subject to any disclaimer, the term of this patent is extended or adjusted under 35 U.S.C. 154(b) by 143 days.

(21) Appl. No.: 13/110,934

(22) Filed: May 19, 2011

(65) Prior Publication Data
US 2012/0177542 A1  Jul. 12, 2012

(30) Foreign Application Priority Data

Jan. 12, 2011  (TW) .............................. 100101138 A

(51) Int. Cl.
*B01J 19/08* (2006.01)
(52) U.S. Cl.
USPC ........ 422/186.04; 422/186.01; 118/723 MW; 156/345.41; 315/111.21; 315/111.51; 315/111.81; 427/571; 427/575
(58) Field of Classification Search
USPC ............... 422/186.04, 186.01; 118/723 MW; 156/345.41; 427/571, 575; 315/111.21, 315/111.51, 111.81
See application file for complete search history.

(56) References Cited

U.S. PATENT DOCUMENTS

| | | | | |
|---|---|---|---|---|
| 5,985,091 A  * | 11/1999 | Suzuki | ..................... | 156/345.42 |
| 6,177,148 B1 | 1/2001 | Walther et al. | | |
| 6,246,175 B1 * | 6/2001 | Kou et al. | ................ | 315/111.21 |
| 2008/0099447 A1 * | 5/2008 | Ando et al. | .............. | 219/121.43 |

FOREIGN PATENT DOCUMENTS

TW  560817  11/2003

OTHER PUBLICATIONS

Ohl et al., "Investigation of plasma surface cleaning in planar low-pressure microwave discharges", Surface and Coatings Technology, vol. 74-75, 1995, pp. 59-62.
Gu et al., "Low-temperature fabrication of silicon films by large-area microwave plasma enhanced chemical vapor deposition", Thin Solid Films, vol. 498, 2006, pp. 14-19.
Kontogeorgos et al., "Plasma generation in silicon-based inductive grid arrays", Optics and Lasers in Engineering, vol. 47, 2009, pp. 1195-1198.

* cited by examiner

*Primary Examiner* — Xiuyu Tai
(74) *Attorney, Agent, or Firm* — Jianq Chyun IP Office

(57)  ABSTRACT

A microwave-excited plasma device is proposed. The device comprises of a plurality of microwave plasma reaction units which are capable of generating plasma independently such that a large-area plasma is able to be generated by all of the units. Besides, the high cost of the large-area microwave coupling window and its deformation together with possible breakage caused by atmospheric pressure can be prevented. Moreover, when a plurality of permanent magnets is assembled upon each of the plasma reaction units, the microwave-excited plasma device is improved to be a large-area electron cyclotron resonance (ECR) plasma device.

2 Claims, 4 Drawing Sheets

MICROWAVE-EXCITED PLASMA DEVICE

CROSS-REFERENCE TO RELATED APPLICATION

This application claims the priority benefit of Taiwan application Ser. No. 100101138, filed Jan. 12, 2011. The entirety of the above-mentioned patent application is hereby incorporated by reference herein and made a part of this specification.

BACKGROUND

1. Field

The disclosure relates to a microwave-excited plasma device having capable of implementing large area plasma fabrication.

2. Description of Related Art

Microwave-excited plasmas are some kinds of plasma excited by microwave power and making neutral gases to be ionized, which have been applied to many fields of plasma processing manufactures such as semiconductor fabrications, solar-cell antireflection coating and carbon nanostructures synthesis.

Escalating the area of the microwave-excited plasmas is an important way to satisfy the aforesaid manufactures which are in demand of large-area plasma processes. Therefore, the areas of the microwave-excited plasma devices have to be extended in two dimensions. Thus, the concept of multiple microwave sources has been researched, such as U.S. Pat. No. 6,177,148B1. However, said patent merely accomplishes a one-dimensional microwave-excited plasma device.

In addition, Taiwan Patent Certification No. 215250 also proposed the concept of multiple microwave sources to actualize the large-area microwave-excited plasma device. However, the area of the microwave coupling window increases as the area of the plasma device escalates. Nevertheless, the microwave coupling window is generally fabricated with large-area flat quartz glass or ceramic. When the area of the microwave coupling window escalates, an atmospheric pressure tolerance thereof is challenged. Thus the large-area microwave coupling window usually deforms or breaks, thereby creating difficulties for escalating the area of the plasma device.

SUMMARY

A microwave-excited plasma device capable of escalating the area of the plasma is introduced herein. The microwave-excited plasma device includes a plasma reaction chamber, a metal sash, a plurality of panes, a plurality of microwave transmitters, and a plurality of waveguides (including impedance matching devices). The metal sash is assembled on the top of the plasma reaction chamber and has a plurality of small-area microwave coupling window openings. The panes are paned in the microwave coupling window openings of the metal sash. The microwave transmitters are disposed outside of the plasma reaction chamber and the waveguides are connected to each of the microwave transmitters and each of the panes respectively to form a plurality of plasma excitation units.

From the foregoing point of view, in order to actualize the large-area (electron cyclotron resonance) microwave-excited plasma device in the disclosure, the multiple plasma excitation units formed by small-area panes (such as quartz glass) together with metal sash are assembled to escalating the area of the device. Consequently, each of the plasma excitation units can generate plasma independently such that a large-area plasma can be generated by all of the units. Besides, the high cost of the large-area microwave coupling window (made of quartz glass or ceramic) and its deformation together with breakage caused by atmospheric pressure can be prevented by using multiple small-area microwave coupling windows instead of a large-area one.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DESCRIPTION OF EMBODIMENTS

Figure 1A:
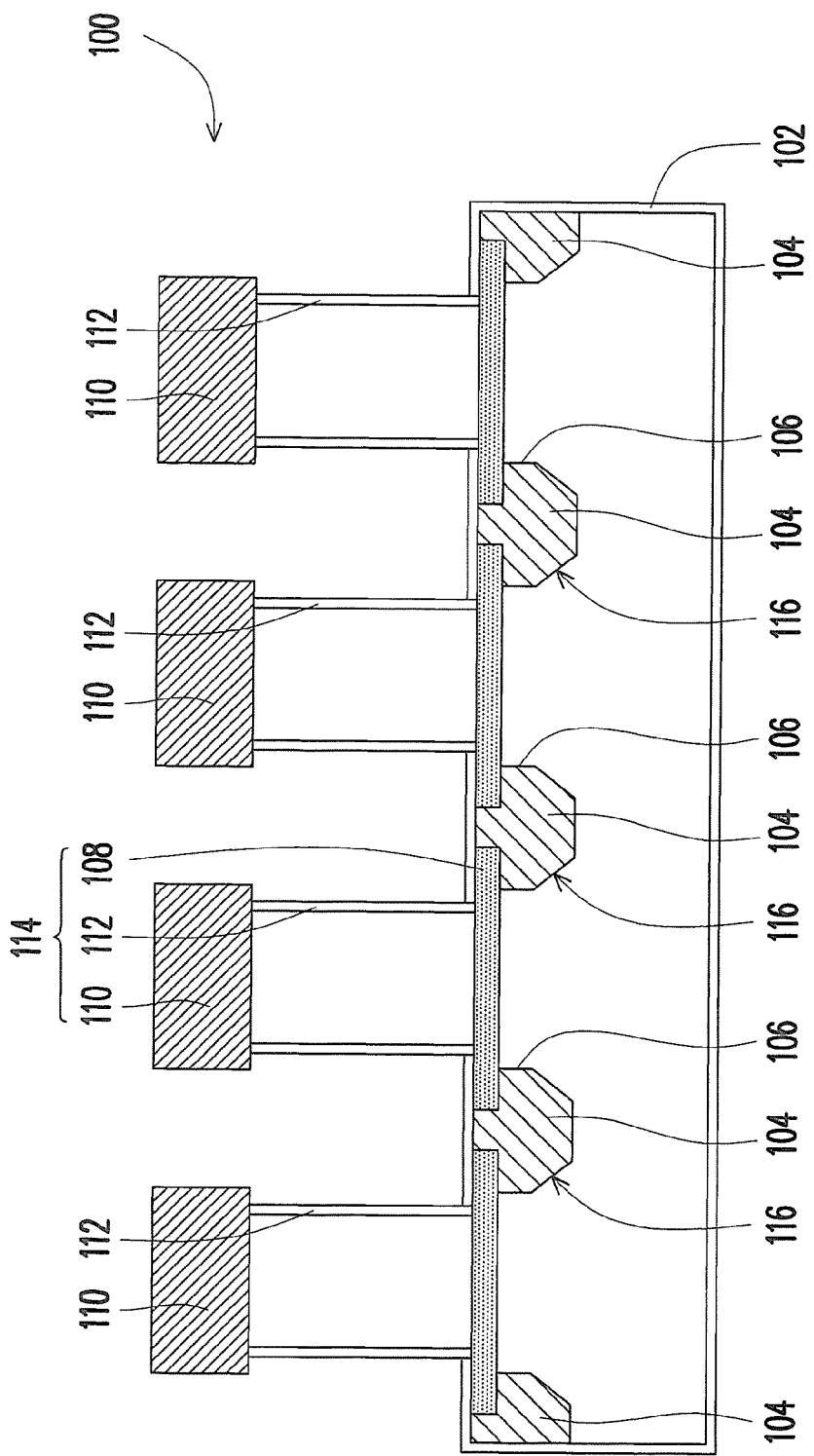
FIG. 1A is a schematic cross-sectional diagram illustrating a microwave-excited plasma device according to a first exemplary embodiment.

To understand the disclosure more thoroughly, please refer to the exemplary embodiment below and the drawings attached. It should be noted that the disclosure can be implemented through various manners and is not limited to the exemplary embodiments described herein. In the drawings, the components and the relative dimensions thereof may not be drawn according to the actual ratio.

FIG. 1A is a schematic cross-sectional diagram illustrating a microwave-excited plasma device according to a first exemplary embodiment.

Referring to FIG. 1A, a microwave-excited plasma device 100 in a first exemplary embodiment at least includes a plasma reaction chamber 102, a metal sash 104 having a plurality of small-area microwave coupling window openings 106, a plurality of panes 108, a plurality of microwave transmitters 110, and a plurality of waveguides 112. The metal sash 104 is assembled on the top of the plasma reaction chamber 102 and fabricated using a metal alloy such as aluminum alloy and so on. The panes 108 are, for example, fabricated with quartz, ceramics or other refractory dielectric materials.

Figure 1B:
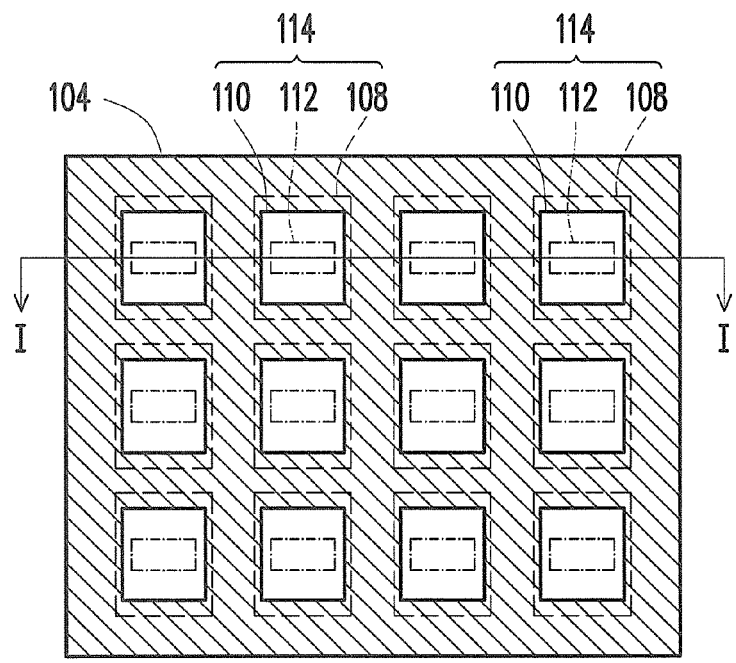
FIG. 1B is a top view of the microwave-excited plasma device in FIG. 1A.

FIG. 1B is a top view of the microwave-excited plasma device in FIG. 1A. Moreover, FIG. 1A is a cross-section taken along line I-I in FIG. 1B.

Figure 2:
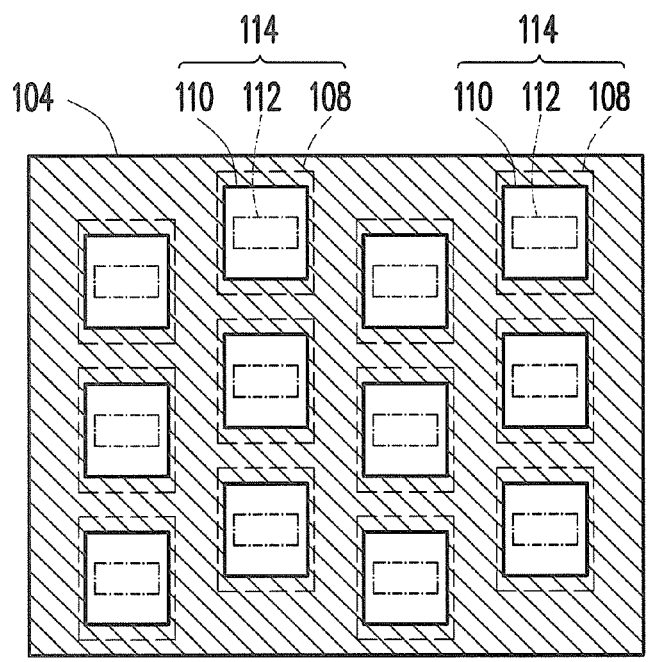
FIG. 2 is a top view of a microwave-excited plasma device in another example of the first exemplary embodiment.

Referring to FIGS. 1A and 1B simultaneously, the panes 108 are paned in the small-area microwave coupling window openings 106 of the metal sash 104. The shadow region in FIG. 1B represents the metal sash 104. The microwave transmitters 110 are disposed outside of the plasma reaction chamber 102. Each of the waveguides 112 is connected to each of the microwave transmitters 110 and each of the panes 108 respectively to form an independent plasma excitation unit 114 capable of generating microwave plasma independently (in a suitable pressure range of $10^{-2}$ Torr-$10^{-1}$ Torr). In order to make the excited plasma diffuse down to the plasma reaction chamber 102 smoothly, an outer margin of each of the window openings 106 is shaped by an incline 116. In addition, the plasma excitation units 114 can be disposed alternately as depicted in FIG. 2. In addition, 12 panes 108 are depicted in FIG. 1B, which means the microwave-excited plasma device 100 has 12 plasma excitation units 114. However, the disclosure is not limited thereto and the dimension of the microwave-excited plasma device 100 and the number of the plasma excitation units 114 disposed therein need to be designed according to the area required by some sort of plasma processes. In other words, the entire area of the microwave-excited plasma device 100 can be escalated as the number of the plasma excitation units 114 is increased. On the other hand, the power output of the microwave transmitter of each set of the plasma excitation units can be monitored individually so as to adjust the plasma density by region. As a consequence, the overall plasma uniformity of the microwave-excited plasma device can be enhanced.

Figure 3:
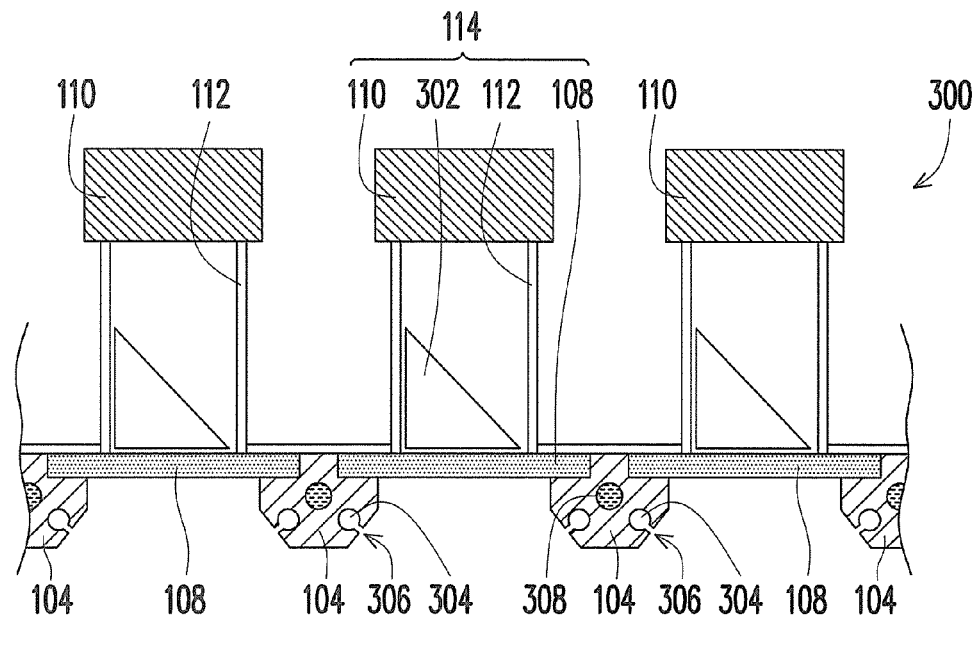
FIG. 3 is a schematic cross-sectional diagram illustrating a microwave-excited plasma device according to a second exemplary embodiment.

FIG. 3 is a schematic cross-sectional diagram illustrating a microwave-excited plasma device according to a second exemplary embodiment. Herein, the elements identical or similar to those in FIG. 1A are denoted with the same notations; however, the locations and the ratios of each of the elements are not shown in their actual conditions.

Referring to FIG. 3, in a microwave-excited plasma device 300 in the second exemplary embodiment, other than the structure noted in the first exemplary embodiment, an impedance matching device 302 such as a tapered dielectric material or a tapered waveguide (not shown in the diagram) can be inserted between each of the microwave transmitters 110 and the plasma reaction chamber 102 to reduce microwave reflected powers. Moreover, a plurality of reaction gas tunnels 304 can be drilled in the metal sash 104 for passing reaction gases to each of the plasma excitation units 114 through the aligned gas inlets 306 which align on the inclines 116 of the microwave coupling window openings 106. A plurality of cooling pipe tunnels 308 is drilled in the metal sash 104 to cool down the permanent magnets 402 and the O rings 404 as shown in following FIG. 4.

Figure 4:
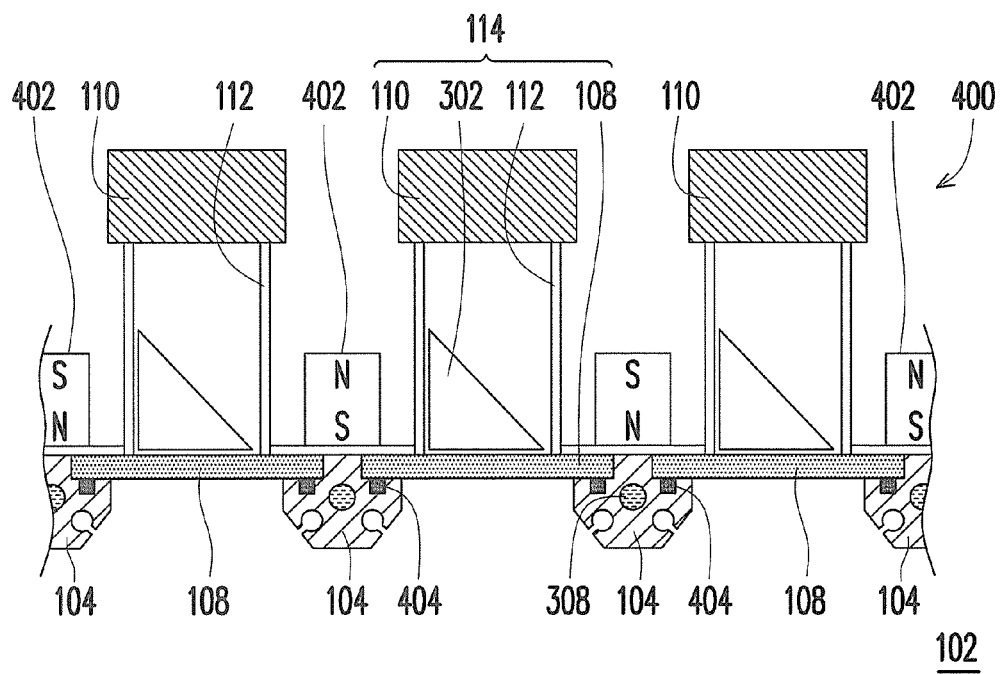
FIG. 4 is a schematic cross-sectional diagram illustrating a microwave-excited plasma device according to a third exemplary embodiment.

FIG. 4 is a schematic cross-sectional diagram illustrating a microwave-excited plasma device according to a third exemplary embodiment. Herein, the elements identical or similar to those in FIG. 3 are denoted with the same notations.

Referring to FIG. 4, in a microwave-excited plasma device 400 of the second exemplary embodiment, a plurality of permanent magnets 402 capable of generating an electron cyclotron resonance (ECR) plasma is disposed on the metal sash 104, and thus this is an ECR plasma excitation device capable of generating an ECR plasma (in a suitable pressure range of $10^{-4}$ Torr-$10^{-2}$ Torr). The permanent magnets 402 can be disposed above the cooling pipe tunnels 308. In the microwave-excited plasma device 400, the O-rings 404 can be disposed in a plurality of pre-set trenches between the metal sash 104 and the panes 108 to implement vacuum environment of the plasma reaction chamber 102.

Figure 5:
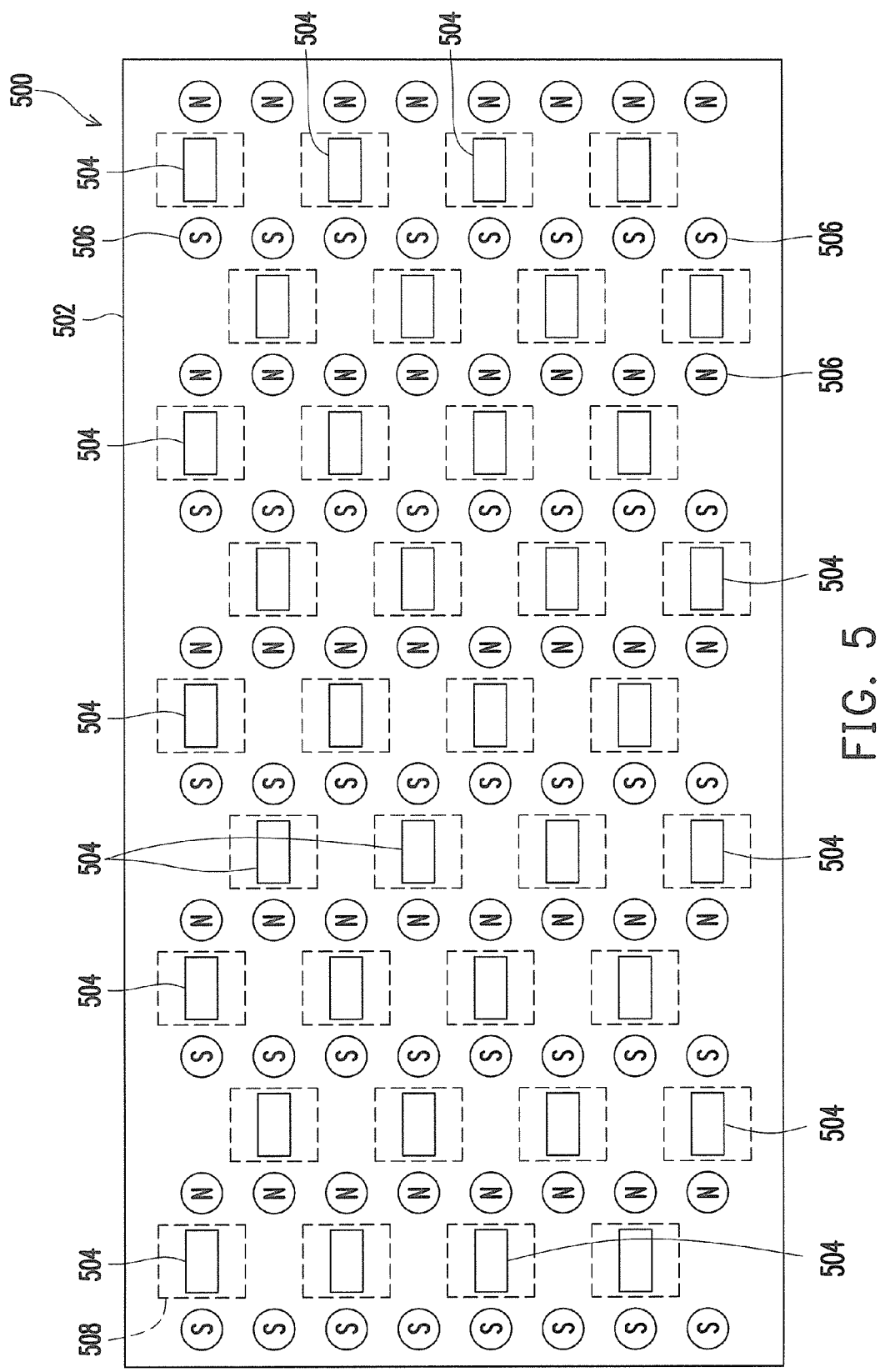
FIG. 5 is a top view of an electron cyclotron resonance (ECR) plasma excitation device constituted by 36 plasma excitation units.

FIG. 5 is a top view illustrating an ECR plasma excitation device 500 constituted by 36 plasma excitation units. Herein, only a metal sash 502, positions of cross-sections of a plurality of waveguides 504, positions of a plurality of permanent magnets 506, and a plurality of window openings 508 in the plasma excitation device 500 are illustrated. The disposition of the permanent magnets 506 is configured for providing the magnetic field required by ECR plasma. Herein, the disclosure is not limited to pillar-shaped magnets and magnets of other shapes can also be adopted.

In summary, the disclosure adopts the multiple plasma excitation device constituted by a plurality of panes together with the metal sash. Thus, each of the plasma excitation units can not only independently generate large-area uniform plasma but also the high cost of the large-area quartz glass and its deformation together with breakage caused by the conventional use of large-area microwave coupling windows can be prevented.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A microwave-excited plasma device, comprising:
 a plasma reaction chamber;
 a metal sash assembled on the top of the plasma reaction chamber, wherein the metal sash comprises a plurality of microwave coupling window openings and a plurality of reaction gas tunnels drilled therein;
 a plurality of permanent magnets disposed on the metal sash respectively and generating an electron cyclotron resonance (ECR) plasma, wherein the metal sash further comprises a plurality of cooling pipe tunnels drilled underneath the permanent magnets correspondingly to cool down the permanent magnets;
 a plurality of panes paned in the microwave coupling window openings of the metal sash;
 a plurality of microwave transmitters disposed outside of the plasma reaction chamber; and
 a plurality of waveguides connected each of the microwave transmitters, wherein one of the microwave transmitters connected with one of the microwave coupling window through one of the waveguides in order to form a plasma excitation unit.

2. The microwave-excited plasma device as claimed in claim 1, wherein each of the plasma excitation unit forms an independently controlled plasma excitation device, such that an entire area of the microwave-excited plasma device is escalated as the number of the plasma excitation units is increased.

* * * * *